US010564756B2

(12) United States Patent
Lee et al.

(10) Patent No.: US 10,564,756 B2
(45) Date of Patent: Feb. 18, 2020

(54) DISPLAY APPARATUS

(71) Applicant: LG Display Co., Ltd., Seoul (KR)

(72) Inventors: Cheolhwan Lee, Paju-si (KR); Soonhwan Hong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/214,637

(22) Filed: Dec. 10, 2018

(65) Prior Publication Data

US 2019/0187849 A1 Jun. 20, 2019

(30) Foreign Application Priority Data

Dec. 19, 2017 (KR) .................. 10-2017-0174824

(51) Int. Cl.
| | |
|---|---|
| *G09G 3/30* | (2006.01) |
| *G09G 3/36* | (2006.01) |
| *G06F 3/041* | (2006.01) |
| *H01L 27/32* | (2006.01) |
| *G09G 3/3233* | (2016.01) |

(52) U.S. Cl.
CPC ........ *G06F 3/0412* (2013.01); *H01L 27/3246* (2013.01); *G09G 3/3233* (2013.01); *G09G 2300/0426* (2013.01)

(58) Field of Classification Search
CPC ................ G09G 3/30–38; G02F 1/13–1326
See application file for complete search history.

(56) References Cited

U.S. PATENT DOCUMENTS

| | | | |
|---|---|---|---|
| 2016/0202516 A1* | 7/2016 | Watanabe | G02F 1/1339 349/130 |
| 2018/0124898 A1* | 5/2018 | Kwon | G02F 1/133308 |
| 2018/0129332 A1* | 5/2018 | Leng | G01L 1/2262 |
| 2018/0349719 A1* | 12/2018 | Lius | G06K 9/00885 |
| 2019/0043452 A1* | 2/2019 | Silvanto | G06F 1/1688 |

* cited by examiner

*Primary Examiner* — Sanghyuk Park
(74) *Attorney, Agent, or Firm* — Morgan, Lewis & Bockius LLP

(57) ABSTRACT

Disclosed is a display apparatus having a module area in a display panel, the display apparatus includes a display panel having an active area including at least one module area and a bezel area positioned outside the active area; and a pixel array positioned on a substrate in the active area, wherein the at least one module area includes the substrate of the display panel and has a thickness smaller than that of the active area excluding the at least one module area.

11 Claims, 3 Drawing Sheets

DISPLAY APPARATUS

CROSS-REFERENCE TO RELATED APPLICATION

This disclosure claims the benefit of priority under 35 U.S.C. § 119(a) to Republic of Korea Patent Application No. 10-2017-0174824 filed on Dec. 19, 2017, which is incorporated herein by reference in its entirety.

BACKGROUND

1. Technical Field

The present disclosure relates to a display apparatus.

2. Discussion of the Related Art

As the information society has advanced, demand for display apparatuses for displaying images in various forms has increased. For example, flat panel displays (FPDs), which are thinner, lighter, and larger than bulky cathode ray tubes (CRTs) and able to replace them, have rapidly been developed. As such FPDs, various FPDs such as a liquid crystal display (LCD), a plasma display panel (PDP), an electroluminescent display (EL), a field emission display (FED), and an electrophoretic display (ED) have been developed and utilized.

Such display apparatuses include a display panel including display elements for displaying information, a driver for driving the display panel, and a power supply for generating power to be supplied to the display panel, and the driver.

These display apparatuses may have various designs according to use environments or purposes, and thus, display panels having a free-form part such as a partially curved part or a notch, beyond a conventional single quadrangular shape, have been widely used because they cause an esthetic sense.

In recent years, a variety of elements such as a camera, a speaker, and a sensor for implementing a multimedia function have been introduced in a module form. These elements are generally positioned in a region where a notch of the display panel is formed, that is, in a region formed by removing a portion of an edge of the display panel.

However, in order to secure the notch portion, to portion of the display panel must be entirely cut out on the cross-sectoin, and thus, an additional mask must be used to implement it.

SUMMARY

Accordingly, embodiments of the present disclosure are directed to a display apparatus that substantially obviates one or more of the problems due to limitations and disadvantages of the related art.

An aspect of the present disclosure is provide a display apparatus in which a module area allowing light to be transmitted therethrough is formed in an active area of a display panel and various modules such as a camera, a speaker, a sensor, and the like, disposed in the module area are not affected by light of the display apparatus or light outside the display apparatus.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display apparatus comprises: a display panel including an active area having at least one module area and a bezel area positioned outside the active area; and a pixel array positioned on a substrate in the active area, wherein the at least one module area includes the substrate of the display panel and has a thickness smaller than that of the active area excluding the at least one module area.

The module area may include a light-transmissive area and at least one dam positioned to surround the light-transmissive area.

The at least one dam may include a first dam surrounding the light-transmissive area and a second dam spaced apart from the first dam and surrounding the first dam.

The at least one module area may be positioned in the active area such that information is displayed in at least two of regions in forward, backward, leftward, and rightward directions surrounding the module area.

The light-transmissive area of the module area may include a passivation layer disposed on the substrate of the display panel.

An area excluding the light-transmissive area of the module area may include at least one dam positioned on the substrate and the passivation layer covering the at least one dam.

The display apparatus further comprises a first potential supply electrode configured to supply a first potential to the pixel array of the active area; a second potential supply electrode configured to supply a second potential lower than the first potential are disposed in the bezel area; and a first potential supply line connected to the first potential supply electrode and extended to the active area to avoid the module area.

The display apparatus further comprises gate lines and data lines configured to gate signals and data signals to the pixel array, respectively in the active area, and the gate lines and the data lines being disposed to avoid the module area.

The display apparatus further comprises another first potential supply electrode configured to supply the first potential to the pixel array, the another first potential supply electrode being positioned in the bezel area on the opposite side of the bezel area where the first potential supply electrode is positioned.

Both ends of the first potential supply electrode and the another first potential supply electrode may be connected by link lines disposed in the bezel areas on the left and right sides of the active area.

The display apparatus further comprises shift registers of a gate driver disposed in the bezel region positioned on both sides of the active area to generate gate signals to be supplied to the pixel array.

According to the display apparatus of the disclosure, it is possible to form the module region allowing light to be transmitted therethrough in the active area of the display panel through the display panel manufacturing process without using a separate mask, whereby a complicated manufacturing process may be avoided and manufacturing time and the cost may be reduced.

Also, since at least one dam is disposed in the module area to surround a light-transmissive area, a module disposed in the module area is not affected by light of the display apparatus or external light, obtaining an effect of enhancing a function of the module itself.

In addition, the light-transmissive area of the module area is left as the three-layer structure of the substrate, the buffer layer, and the second passivation film, and when the buffer layer is omitted, the light-transmissive area of the module area is left as only the two-layer structure of the substrate and the second passivation film, obtaining an effect of enhancing light transmission efficiency.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
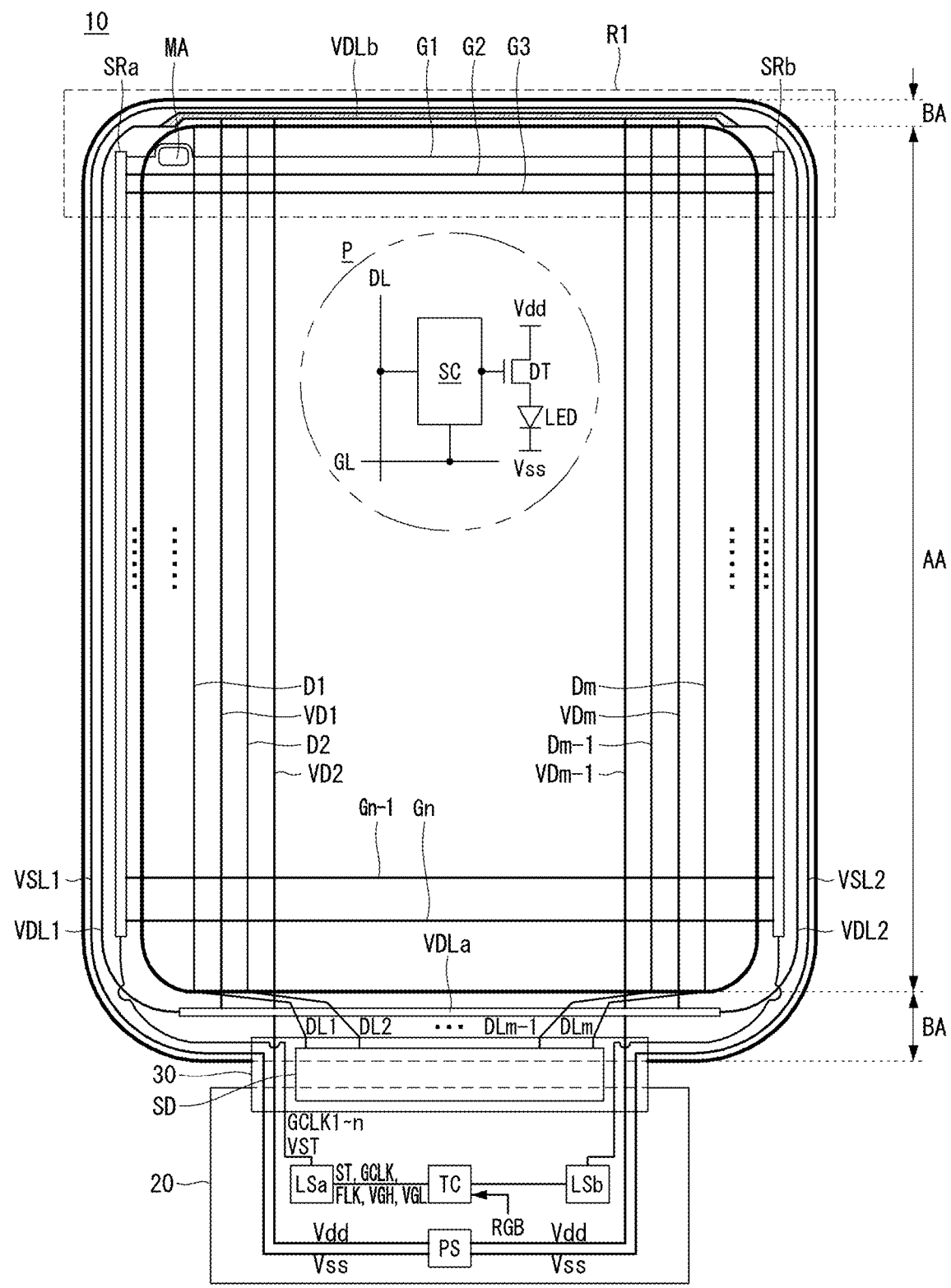
FIG. 1 is a block diagram schematically illustrating a display apparatus according to an embodiment of the disclosure.

Advantages and features of the disclosure, and implementation methods thereof will be clarified through following embodiments described with reference to the accompanying drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Further, the disclosure is only defined by scopes of claims.

The shapes, sizes, ratios, angles, numbers and the like disclosed in the drawings for describing the embodiments of the disclosure are illustrative and are not limited to those illustrated in the disclosure. Like reference numerals refer to like elements throughout the specification. Further, in the description of the disclosure, detailed description of known related arts will be omitted if it is determined that the gist of the present disclosure may be unnecessarily obscured. Where the terms "comprises", "having", "consist of", and the like are used in this disclosure, other portions may be added as long as "only" is not used. Unless the context clearly dictates otherwise, including the plural unless the context clearly dictates otherwise.

In analyzing constructional elements, the element is construed as including an error range although there is no explicit description.

In describing a position relationship, for example, when two portions are described as "~on", "~above", "~below", or "~on the side", one or more other portions may be positioned between the two portions unless "immediately" or "directly" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the disclosure.

In this disclosure, a pixel circuit and a gate driver formed on a substrate of a display panel may be implemented by a thin film transistor (TFT) having a p-type metal oxide semiconductor field effect transistor (MOSFET) structure, but the technical idea of the disclosure is not limited thereto. The TFT is a three-electrode element including a gate, a source, and a drain. The source is an electrode supplying a carrier to the transistor. In the TFT, carriers start to flow from the source. The drain is an electrode through which the carrier exits the TFT. That is, in the MOSFET, the carriers flow from the source to the drain. In the case of a p-type TFT (PMOS), since the carrier is a hole, a source voltage is higher than a drain voltage so that holes may flow from the source to the drain. In the p-type TFT, since the holes flow from the source to the drain, current flows from the source to the drain. It should be noted that the source and drain of the MOSFET are not fixed. For example, the source and drain of the MOSFET may be changed depending on an applied voltage. Therefore, in descriptions of an embodiment of the disclosure, any one of the source and the drain may be referred to as a first electrode and the other of the source and the drain may be referred to as a second electrode.

Features of various embodiments of the disclosure may be partially or overall coupled to or combined with each other, and may be variously inter-operated with each other as those skilled in the art may sufficiently understand. The embodiments of the disclosure may be carried out independently from each other, or may be carried out together in co-dependent relationship.

Hereinafter, a display apparatus according to embodiments of the disclosure will be described in detail with reference to the accompanying drawings. Throughout the specification, the like reference numerals denote the substantially same elements. In the following description, when the detailed description of the relevant known function or configuration is determined to unnecessarily obscure an important point of the disclosure, the detailed description will be omitted or brief description will be provided.

Hereinafter, a display apparatus according to an embodiment of the disclosure will be described with reference to FIGS. 1 to 3.

FIG. 1 is a block diagram illustrating a display apparatus according to an embodiment of the disclosure. FIG. 2 is a plan view schematically illustrating a partial region R1 of a display panel illustrated in FIG. 1, including an enlarged view of a module area, and FIG. 3 is a cross-sectional view taken along line I-I' of FIG. 2.

Figure 2:
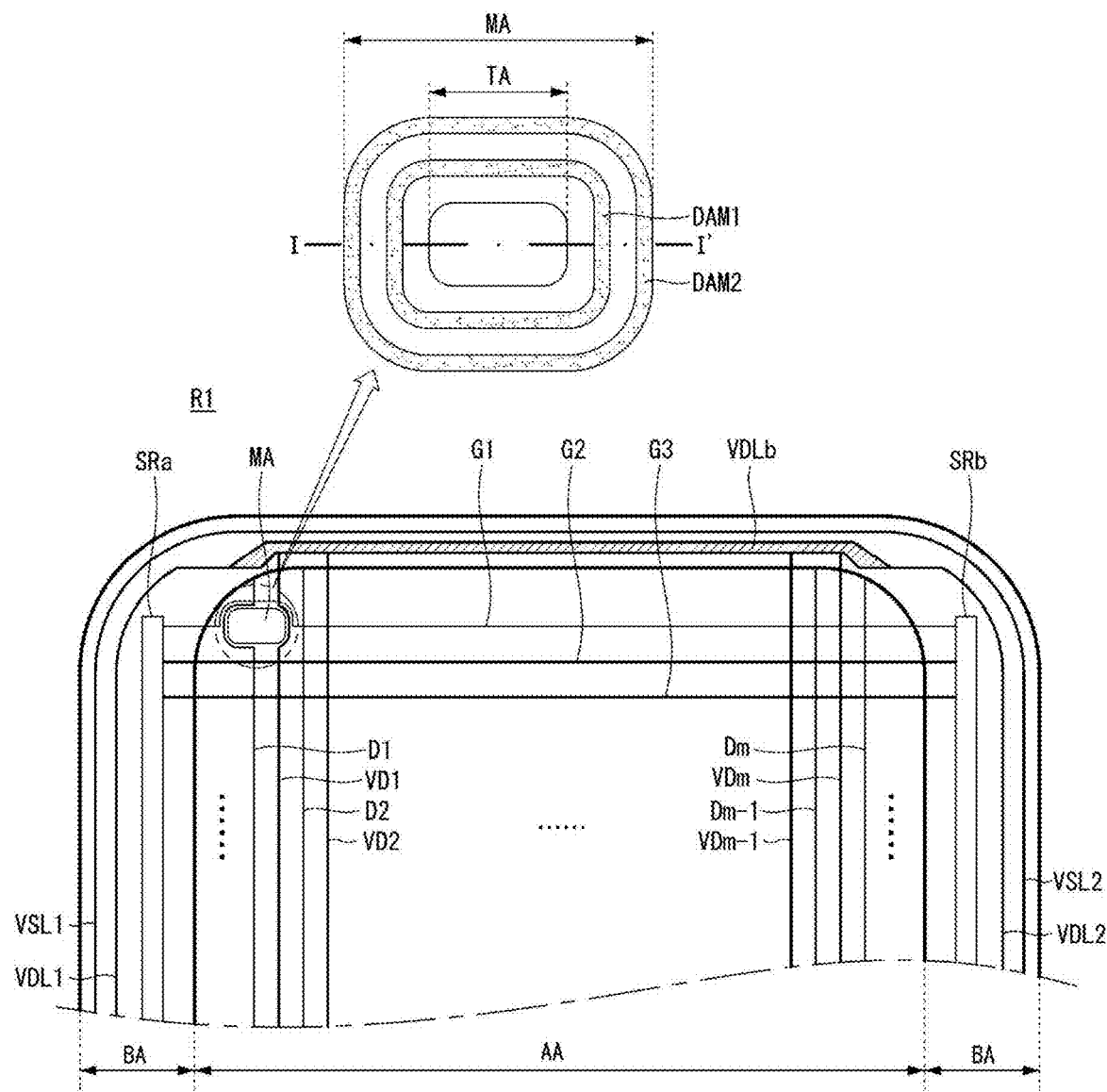
FIG. 2 is a plan view specifically illustrating a partial region R1 of a display panel illustrated in FIG. 1.

Referring to FIGS. 1 and 2, a display apparatus according to an embodiment of the disclosure may include a display panel 10, a data driver, a gate driver, a power supply PS, a timing controller TC, and the like.

The display panel 10 includes an active area AA for displaying information and a bezel area BA which does not display information.

The active area AA is an area where an input image is displayed and a pixel array in which a plurality of pixels P are arranged in a matrix form is disposed.

The bezel area BA is an area where shift registers SRa and SRb of a gatedriver, various link signal lines (e.g., DL1 to DLm) and link power supply lines (e.g. VDL1 and VDL2), power lines (e.g. VSL1, and VSL2), power supply electrodes (e.g. VDLa and VDLb), and the like are disposed. The pixel array arranged in the active area AA includes a plurality of data lines D1 to Dm and a plurality of gate lines G1 to Gn arranged to intersect each other and pixels P arranged in a matrix form in the intersections.

Each pixel P includes a light emitting diode LED, a driving thin film transistor (hereinafter, referred to as a driving TFT DT for controlling the amount of current flowing in the LED, and a programming part SC for setting a gate-source voltage of the driving TFT DT. The pixels P of the pixel array are supplied with a first voltage Vdd, as a high potential voltage, from the power supply PS through the first power lines VD1 to VDm, and are supplied with a second voltage Vss, as a low potential voltage, through second power lines VSL1 to VSL2.

The first power lines VD1 to VDm is supplied with the first voltage Vdd from the power supply PS at both sides through the lower power supply electrode VDLa positioned in a bezel area BA at the side where a chip-on film 30 is adhered and the upper power supply electrode VDLb disposed on the opposite bezel area. Both ends of the lower first power supply electrode VDLa and the upper first power supply electrode VDLb may be connected to each other by link power supply lines VDL1 and VDL2. Accordingly, a degradation of display quality due to an increase in resistance capacitance (RC) according to positions of pixels disposed in the active area AA may be minimized.

The programming part SC may include at least one switching TFT and at least one storage capacitor. The switching TFT is turned on in response to a scan signal from the gate line GL, thus applying a data voltage from the data lines D1 to Dm to one electrode of the storage capacitor. The driving TFT DT controls a current amount supplied to the light emitting diode LED according to a magnitude of a voltage charged in the storage capacitor to regulate light intensity of the light emitting diode LED. Light intensity of the light emitting diode LED is proportional to the current amount supplied from the driving TFT DT.

TFTs constituting the pixel P may be implemented as a p-type or an n-type. Further, semiconductor layers of the TFTs constituting the pixel may include amorphous silicon or polysilicon, or an oxide. The LED includes an anode electrode, a cathode electrode, and a light emitting structure interposed between the anode electrode and the cathode electrode. The anode electrode is connected to the driving TFT DT. The light emitting structure includes an emission layer (EML), and a hole injection layer (HIL) and a hole transport layer (HTL) may be formed on one side of the emission layer and an electron transport layer (ETL) and an electron injection layer (EIL) may be disposed on the other side of the emission layer EML.

The data driver includes a chip-on film 30 on which a data IC SD is mounted. One side of the chip-on film 309 is connected to one end of a source PCB 20 and the other side thereof is adhered to the bezel area BA of the display panel 10.

The data IC SD converts digital video data input from the timing controller TC into an analog gamma compensation voltage to generate a data voltage. The data voltage output from the data IC SD is supplied to the data lines D1 to Dm through link signal lines DL1 to DLn.

The gate driver may be a type in which a chip-on-film having a gate IC mounted thereon is disposed on one side of a display panel or a GIP type in which a gate IC is formed on the display panel. In the disclosure, the GIP type gate driver will be described as an example.

The GIP type gate driver includes level shifters LSa and LSb mounted on the source PCB 20 and shift registers SRa and SRb formed in the bezel area BA of the display panel 10 and receiving signals supplied from the level shifters LSa and LSb.

The level shifters LSa and LSb receive signals such as a start pulse ST, gate shift clocks GCLK, a flicker signal FLK, and the like, from the timing controller TC and receive a driving voltage such as a gate high voltage (VGH), a gate low voltage (VGL), and the like. The start pulse ST, the gate shift clocks GCLK, and the flicker signal FLK are signals swinging between approximately 0V and 3.3V. The gate shift clocks GCLK1-$n$ are n-phase clock signals having a predetermined phase difference. The gate high voltage VGH is a voltage equal to or higher than a threshold voltage of a TFT formed in a TFT array of the display panel 10 and is about 28V. The gate low voltage VGL is a voltage lower than the threshold voltage of the TFT formed in the TFT array of the display panel 10 and is about −5V or so.

The level shifter LSa and LSb level-shifts a start pulse ST and gate shift clocks GCLK input from the timing controller TC to output a start pulse VST and gate shift clock signals GCLKK1-$n$ which are shifted to a gate high voltage VGH and a gate low voltage VGL. The gate shift clocks $GCLK_1$-n are n-phase clock signals having a predetermined phase difference. Therefore, a start pulse VST and shift clock signals CLK output from the level shifter LSa and LSb swing between the gate high voltage VGH and the gate low voltage VGL. The level shifter LSa and LSb may lower the gate high voltage according to a flicker signal FLK to lower a kickback voltage $\Delta Vp$ of a liquid crystal cell to reduce flicker.

The output signals of the level shifter LSa and LSb may be supplied to the shift registers SRa and SRb through lines formed in the chip-on film 30 in which the data IC SD is positioned and line-on-glass (LOG) lines formed at the substrate of the display panel 10. The shift register SRa and SRb may be formed directly on the bezel area BA of the display panel 10 through a GIP process.

The shift register SRa and SRb sequentially shifts gate pulses swinging between the gate high voltage VGH and the gate low voltage VGL by shifting the start pulse VST input from the level shifter LSa and LSb according to the gate shift clock signals CLK1 to CLKn. The gate pulses output from the shift register SRa and SRb are sequentially supplied to the gate lines G1 to Gn.

The timing controller TC synchronizes an operation timing of the data IC SD and the gate drivers including LSa, LSb, SRa, and SRb upon receiving a timing signal such as a vertical synchronization signal, a horizontal synchronization signal, a data enable signal, and a main clock inputted from a host system (not shown). A data timing control signal for controlling the data IC SD may include a source sampling clock (SSC), a source output enable (SOE) signal, and the like. A gate timing control signal for controlling the gate drivers LSa, LSb, SRa and SRb may include a gate start pulse (GSP), a gate shift clock (GSC), gate output enable (GOE) signal, and the like.

In FIG. 1, a configuration in which the shift registers SRa and SRb are disposed at both sides of the active area AA outside the active area AA to supply gate pulses to the gate lines G1 to Gn from both ends of the active area AA is illustrated. However, the disclosure is not limited thereto and the shift register may be disposed only on one side of the active area AA to supply gate pulses to the gate lines G1 to Gn from one side of the active area AA. When the shift registers SRa and SRb are disposed on both sides outside the active area AA, gate pulses having the same phase and the same amplitude are supplied to the gate lines arranged in the same horizontal line of the pixel array.

Referring to FIG. 2, the display panel 10 of the disclosure includes the active area AA and the bezel area BA outside the active area AA.

The active area AA is an area where a pixel array for displaying information such as characters, figures, pictures, photographs, and images is arranged. The active area AA may include at least one module area MA positioned in a region adjacent to the corner of the active area AA or one side of the active area AA.

The module area MA is an area where a camera, a speaker, a sensor, and the like, are disposed and may include a light-transmissive area TA and at least one dam (two dams DAM1 and DAM2 in the example of FIG. 2) disposed to surround the light-transmissive area TA.

In the module area MA, signal lines including gate lines G1 to Gn and data lines D1 to Dm for supplying signals to the pixel array, the first power lines VD1 to VDm, and the like, are not disposed.

The module area MA may be disposed anywhere in the active area AA, and information may be displayed on at least one of the upper side, the left side, the right side, and the lower side of the module area MA on the plan view according to arrangement positions thereof.

The bezel area BA is an area surrounding the active area AA from the outside the active area AA. Shift registers SRa and SRb for generating a gate pulse to be supplied to the pixel array of the active area AA, signal lines for supplying various signals, and power supply lines for supplying various kinds of power are disposed in the bezel area BA.

Hereinafter, a cross-sectional structure of a display apparatus according to the disclosure will be described with reference to FIG. 3. FIG. 3 illustrates an example in which information is displayed on the upper side, the lower side, the left side, and the right side of the module area MA, and this is to help understanding of the disclosure. Therefore, the disclosure should not be construed as being limited to FIG. 3 and the related description.

Figure 3:
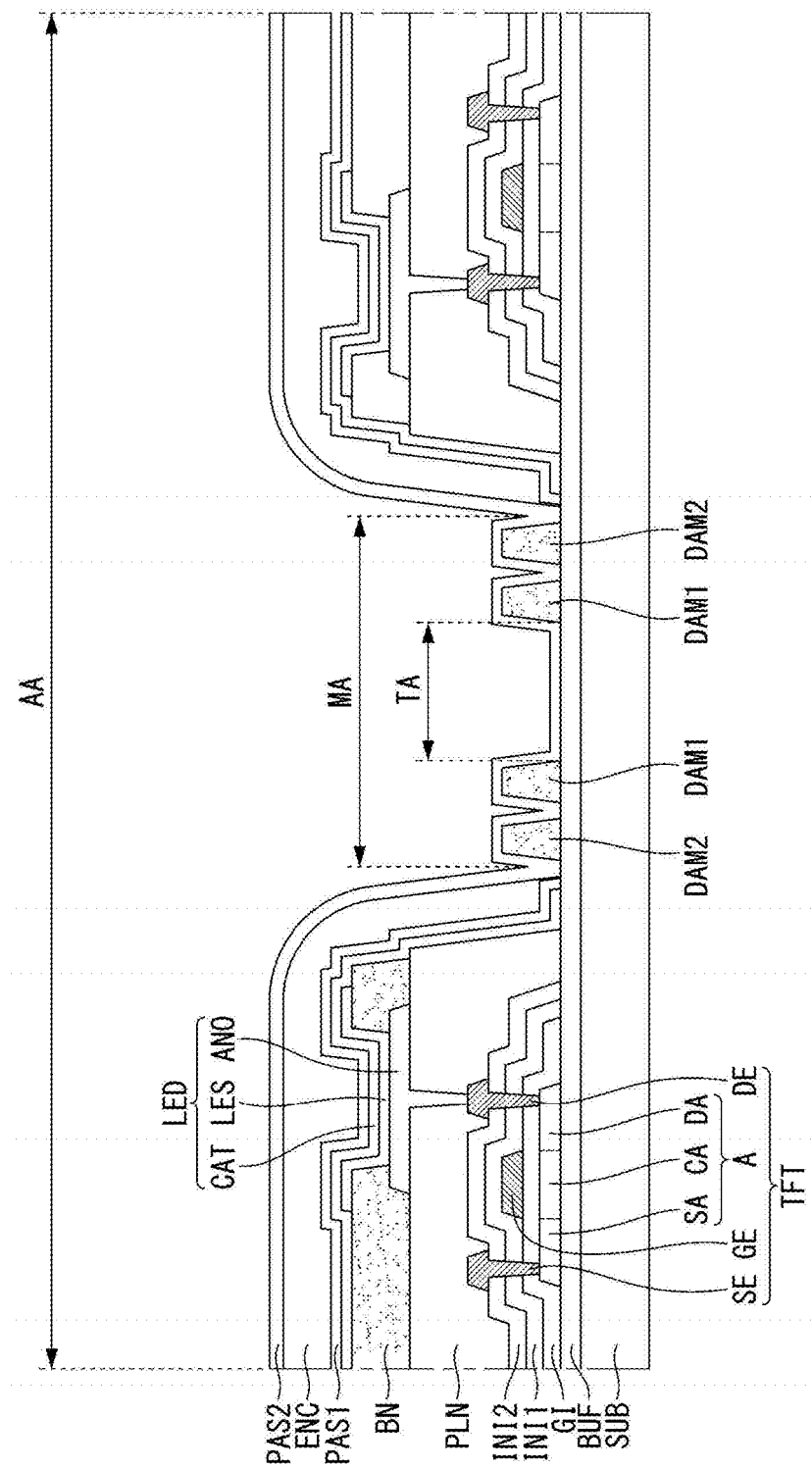
FIG. 3 is a cross-sectional view taken along line I-I' of FIG. 2.

Referring to FIG. 3, a buffer layer BUF having a single-layer structure or a multi-layer structure may be disposed on a substrate SUB. The substrate SUB may be formed of a flexible reflective-transmissive material. When the substrate SUB is formed of a material such as polyimide, the buffer layer BUF may be formed of any one of an inorganic material and an organic material to prevent damage to the light emitting device due to an impurity such as an alkali metal ion, or the like, that flows out from the substrate SUB during a subsequent process. The inorganic material may include any one of silicon oxide ($SiO_2$) and silicon nitride (SiNx), and the organic material may include photoacryl.

A semiconductor layer A is positioned on the buffer layer BUF at each pixel of the active area AA. The semiconductor layer A includes a source region SA and a drain region DA spaced apart from each other with a channel region CA interposed therebetween. The source region SA and the drain region DA are conductive regions. The semiconductor layer A may be formed using amorphous silicon or polycrystalline silicon crystallized from amorphous silicon. Alternatively, the semiconductor layer A may be formed of any one of zinc oxide (ZnO), indium zinc oxide (InZnO), indium gallium zinc oxide (InGaZnO), and zinc tin oxide (ZnSnO). Further, the semiconductor layer A may be formed of a low-molecular or high-molecular organic material such as melocyanine, phthalocyanine, pentacene or thiophene polymer.

A gate insulating film GI is positioned on the buffer layer BUF on which the semiconductor layer A is positioned, to cover the semiconductor layer A. In the module area MA, the gate insulating film GI is not positioned. The gate insulating film GI may be formed of a silicon oxide film (SiOx), a silicon nitride film (SiNx), or a dual-layer thereof.

A gate electrode GE of the TFT and a gate line (not shown) connected to the gate electrode are disposed on the gate insulating film GI in the active area AA such that at least a partial region thereof overlaps the channel layer CA of the semiconductor layer A. The gate electrode GE and the gate line may be formed of any one selected from the group consisting of molybdenum (Mo), aluminum (Al), chrome (Cr), gold (Au), titanium (Ti), nickel (Ni), and copper (Cu), or an alloy thereof, and may be formed as a single layer or multiple layers.

First and second interlayer insulating films INT1 and INT2 are sequentially disposed on the gate insulating film GI on which the gate electrode GE and the gate lines are disposed, to cover them. In the module area MA, the first and second interlayer insulating films INT1 and INT2 are not disposed. The first and second interlayer insulating films INT1 and INT2 may be formed of a silicon oxide film (SiOx) or a silicon nitride film (SiNx). One of the first and second interlayer insulating films INT1 and INT2 may be omitted.

A source electrode SE and a drain electrode DE of the TFT and a data line (not shown) connected to the source electrode SE are disposed on the second interlayer insulating film INT2 in the active area AA. The source electrode SE and the drain electrode DE are connected to the source region SA and the drain region DA of the semiconductor layer exposed through contact holes penetrating through the gate insulating film GI and the first and second interlayer insulating films INT1 and INT2, respectively. In the module area MA, the source electrode SE and the drain electrode DE of the TFT and the data line are not disposed. The data line is disposed to bypass to the left side or right side of the module area AA.

A planarizing film PLN may be positioned on a passivation film covering the source electrode SE and the drain electrode DE. In the module area MA, the passivation film PAS and the planarizing film PLN are not disposed. The planarizing film PLN serves to protect a lower structure, while alleviating a step of the lower structure, and may be formed of a silicon oxide film (SiOx) or a silicon nitride film (SiNx).

On the planarizing film PLN, an anode electrode ANO is disposed in each pixel. The anode electrode ANO is connected to the drain electrode DE of the TFT exposed through a contact hole penetrating through the planarizing film PLN. In the module area MA, the anode electrode ANO is not disposed. The anode electrode ANO may be formed of a transparent conductive material such as indium tin oxide (ITO), indium zinc oxide (IZO), or zinc oxide (ZnO).

On the planarizing film PLN, a bank layer BN having an opening exposing the anode electrode ANO is formed. The opening of the bank layer BN is a region defining an emission area. On the buffer layer BUF of the module area MA, at least one dam DAM1 and DAM2 formed of the same material as that of the bank layer BN is disposed to define the light-transmissive area TA.

A light emitting stack LES and a cathode electrode CAT are sequentially arranged on the anode electrode ANO exposed through the emission area of the bank layer BN. The light emitting stack LES may be formed on the anode electrode ANO in the opening of the bank layer BN in order of a hole-related layer, an organic light emitting layer, and an electron-related layer, or in the reverse order. The cathode electrode CAT may be disposed on the planarizing film PLN so as to cover the bank layer BN and the light emitting stack LES in the entire region of the active area AA. It is preferable that the cathode electrode CAT is not positioned in the module area MA. The cathode electrode CAT may be formed of magnesium (Mg), calcium (Ca), aluminum (Al), silver (Ag), or an alloy thereof having a low work function.

A first passivation film PAS1 may be positioned on the planarizing film PLN2 to cover the cathode electrode CA and the bank layer BL in the active area AA and the bezel area BA. The first passivation film PAS1 is not disposed in the module area MA.

An encapsulation layer ENC may be positioned on the first passivation film PAS1. The encapsulation film ENC is not positioned in the module area MA. The encapsulation layer ENC may serve to minimize penetration of moisture or oxygen from the outside into the light emitting stack LES positioned in the encapsulation layer DNC and may have a multilayer structure in which an inorganic layer and an organic layer are alternately arranged.

A second passivation film PAS2 is poisoned on the encapsulation layer ENC and at least one dam DAM1 and DAM2 of the module area MA to protect the encapsulation layer ENC and the dam DAM1 and DAM2.

A polarization film (not shown) may be positioned on the second passivation film PAS2 in order to reduce an influence of external light such as surface reflection that external light is reflected from a surface of the display panel or electrode reflection that external light traveling to the inside of the display panel is reflected from electrodes inside the display panel. However, the polarization film is not positioned in the module area MA.

On a lower surface of the substrate SUB corresponding to the module area MA of the active area AA, elements difficult to be integrated into the display panel such as a camera module, a speaker module, and a sensor module may be arranged.

The module area MA, including the transmissive area TA through which light may be transmitted, is an area from which an opaque material such as signal lines including the gate lines and the data lines, the power line, the electrodes, and the like, or an insulating material not having good light transmittance is removed. In the example of FIG. 3, the TFT and the light emitting diode LED arranged on the pixels positioned at both sides of the module area MA illustrated in FIG. 2 are illustrated for simplification of description.

As described above, according to the display apparatus according to the embodiment of the disclosure, since the module area MA allowing light to be transmitted therethrough is formed in the active area AA of the display panel through a display panel manufacturing process even without using a separate mask, a complicated manufacturing process may be avoided and a manufacturing time and cost may be reduced.

Also, since at least one dam DAM1 and DAM2 is disposed in the module area to surround a light-transmissive area TA, a signal from a module disposed in the module area is not affected by light, thereby obtaining an effect of enhancing a function of the module itself.

In addition, the light-transmissive area TA of the module area MA is left as a three-layer structure of the substrate SUB, the buffer layer BUF, and the second passivation film PAS2, and when the buffer layer is omitted, the light-transmissive area TA of the module area MA is left as only the two-layer structure of the substrate SUB and the second passivation film PAS2, obtaining an effect of enhancing light transmission efficiency.

Further, since the module area MA may be positioned at any desired position in the active area AA and all the remaining active areas, excluding the module area MA, may be utilized as a display area, an effect of increasing the degree of freedom in design may be obtained. In the example illustrated in the disclosure, the electroluminescence display apparatus has been described but the disclosure is not limited thereto and may be applied to various flat display apparatuses such as a liquid crystal display apparatus (LCD), a plasma display panel (PDP), a field emission display apparatus (FED), and an electrophoretic display apparatus (ED).

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus, comprising:
    a display panel including an active area having at least one module area, and a bezel area positioned outside the active area; and
    a pixel array positioned on a substrate in the active area, wherein the at least one module area is formed as a light-transmissive area,
    wherein the at least one module area includes the substrate of the display panel and has a thickness smaller than that of the active area excluding the at least one module area.

2. The display apparatus of claim 1, wherein
    each of the at least one module area includes a light-transmissive area and at least one dam positioned to surround the light-transmissive area.

3. The display apparatus of claim 1, wherein
    the at least one dam includes a first dam surrounding the light-transmissive area and a second dam spaced apart from the first dam and surrounding the first dam.

4. The display apparatus of claim 1, wherein
    each of the at least one module area is positioned in the active area such that information is displayed in at least two of regions in forward, backward, leftward, and rightward directions surrounding the module area.

5. The display apparatus of claim 1, wherein
    the light-transmissive area of the at least one module area includes a passivation layer disposed on the substrate of the display panel.

6. The display apparatus of claim 5, wherein
    an area excluding the light-transmissive area of the at least one module area includes at least one dam positioned on the substrate and the passivation layer covering the at least one dam.

7. The display apparatus of claim 1, further comprising:
    a first power supply electrode configured to supply a first potential to the pixel array of the active area;
    a second power supply electrode configured to supply a second potential lower than the first potential are disposed in the bezel area; and
    a first power line connected to the first potential supply electrode and extended to the active area to avoid the module area.

8. The display apparatus of claim 7, further comprising:
    another first power supply electrode configured to supply the first potential to the pixel array, the another first power supply electrode being positioned in the bezel area on the opposite side of the bezel area where the first power supply electrode is positioned.

9. The display apparatus of claim 8, wherein both ends of the first power supply electrode and the another first power supply electrode are connected by link power supply lines disposed in the bezel areas on the left and right sides of the active area.

10. The display apparatus of claim 1, further comprising: gate lines and data lines configured to provide gate signals and data signals to the pixel array, respectively in the active area, and the gate lines and the data lines being disposed to avoid the module area.

11. The display apparatus of claim 1, further comprising: shift registers of a gate driver disposed in the bezel region positioned on both sides of the active area to generate gate signals to be supplied to the pixel array.

* * * * *